United States Patent

Meyer et al.

[15] 3,651,513

[45] Mar. 21, 1972

[54] DATA-CONVERTING APPARATUS

[72] Inventors: Charles Meyer, St. Germain-en-Laye; Francois Maison, Eaubonne; Paul Sangouard, Fontenay-le-Fleury, all of France

[73] Assignee: Electronique Marcel Dassault, Paris, France

[22] Filed: Jan. 18, 1968

[21] Appl. No.: 698,762

[30] Foreign Application Priority Data

Jan. 20, 1967 France....................................91,862

[52] U.S. Cl.......................340/347 AD, 235/150.5, 235/186, 340/347 SY

[51] Int. Cl.......................G06g 7/22, G06j 1/00, H03k 13/00

[58] Field of Search..................340/347; 235/150.5, 150.52, 235/150.53, 186, 197

[56] References Cited

UNITED STATES PATENTS

| | | | |
|---|---|---|---|
| 3,241,133 | 3/1966 | Herzel | 340/347 |
| 3,277,464 | 10/1966 | Naydan et al. | 340/347 |
| 3,310,799 | 3/1967 | Ohashi | 340/347 |
| 3,325,805 | 6/1967 | Dorey | 340/347 |
| 3,396,380 | 8/1968 | Ohashi | 340/347 |
| 3,480,947 | 11/1969 | Naydan | 340/347 |
| 3,484,589 | 12/1969 | Jernakoff | 235/150.5 X |
| 3,566,393 | 2/1971 | Girault et al. | 340/347 DA |

*Primary Examiner*—Maynard R. Wilbur
*Assistant Examiner*—Thomas J. Sloyan
*Attorney*—Karl F. Ross

[57] ABSTRACT

An analogue/digital converter includes a digital register for the storage of the magnitude of an angle $a$, this magnitude $a$ and its complement $\pi/2-a$ being fed by respective outputs of the register to a pair of calculating networks each inserted between a first and a second amplifier stage. The first amplifier stage associated with either network receives an analogue signal in the form of a respective input voltage $U_1$, $U_2$ together with a degeneratively feed-back voltage $U'_1$, $U'_2$ from the corresponding output stage. The two first stages have the same gain G so that, if the combined gain of each network and its second amplifier stage is unity, $U'_1 = Ga(U_1 = U'_1)$ and $U'_2 = G(\pi/2 - a)(U_2 - U'_2)$ which for a value $G = 0.3534$, *yields the relationship* $U_2/U_1$ — tan $a$ whenever $U'_1 = U'_2$. This identity can be established by a comparator, connected to the two second-stage outputs, which feeds back an error signal to the digital register to modify the value of $a$ until the two output voltages are equal. Conversely, with $U_1 = U_2$, tan $a$ equals the ratio of voltages $U'1$ to $U'_2$ which are therefore proportional to sin $a$ and cos $a$, respectively.

6 Claims, 3 Drawing Figures

Charles MEYER
François MAISON
Paul SANGOUARD

Inventors

Charles MEYER
François MAISON
Paul CANGOUARD
Inventors

DATA-CONVERTING APPARATUS

The invention relates to a converting device or coder for angular data.

It is an object of the invention to provide a device which supplies digital values of an angle from analogue values of two trigonometrical functions of said angle.

A related object of the invention is to provide such a device which works by electronic means and can thus be incorporated in electronic data-processing equipment without imposing limitations on the latter but, on the contrary, with enhanced possibilities of use.

It is likewise an object of the invention to provide such a device which is capable of being incorporated in existing data-processing installations and which, apart from its main purpose, performs additional operations, thus enabling the realization of systems of reduced weight and overall size.

It is also an object of the present invention to provide a device which, conversely, derives from the value of an angle expressed in digital form a pair of analogue values whose quotient represents a trigonometrical function of said angle.

It is further an object of the invention to provide such a device which uses simple components for its construction.

In general, therefore, our invention aims at providing a device which extends the field of application of data-processing machines without increasing the complexity thereof.

In the following description, given by way of example, reference is made to the accompanying drawing in which.

Figure 1:
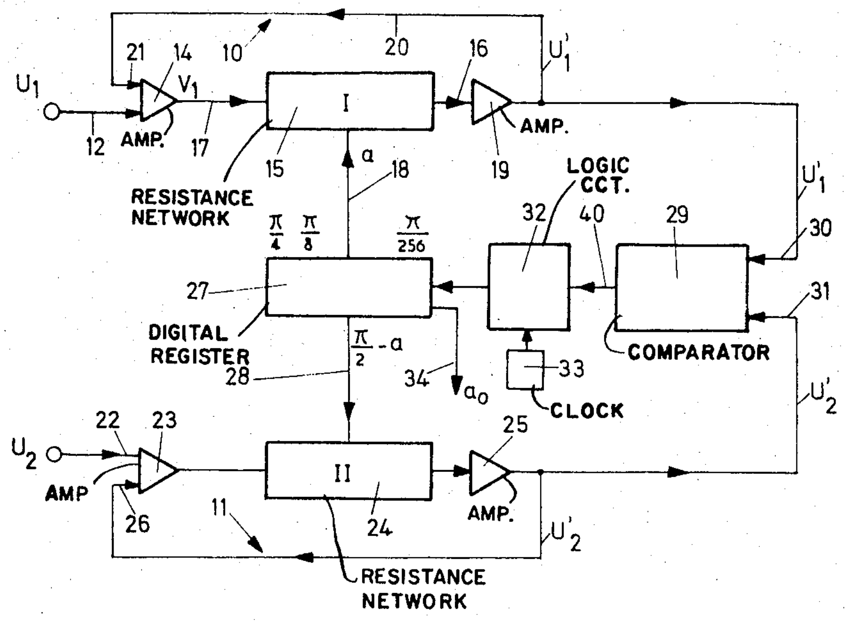
FIG. 1 is a diagram of a coding device according to the invention, for a first mode of use.

The coder according to the invention comprises two identical voltage-transformation circuits, 10 and 11, to the inputs 12 and 13 of which there are applied a voltage $U_1$ and a voltage $U_2$, respectively.

The input 12 of the first circuit 10 is one of the two inputs of an amplifier 14 of gain $G$ which feeds a resistor matrix 15, or calculating network I, which is a linear network of the type conventionally used in devices for converting analogue data into digital data and vice versa.

At one of its inputs 18, connected to a digital register 27, the network 15 receives the control value and so delivers, at its output 16, a signal which is the product of said control value times the voltage applied to its other input 17 connected to the output of amplifier 14. The network 15 is followed by a matching amplifier 19 from which the output voltage, of value $U'_1$, is applied over a line 20 to the other, subtractive, input 21 of the amplifier 14, the network 15 thus forming part of a first degenerative feedback loop.

The digital register 27 contains, in binary form, various angle values expressed in fractions of $\pi$, the greatest weight corresponding to $\pi/4$ for example. In the example, the register has seven bits having the respective weights $\pi/4$, $\pi/8$,. . . $\pi/256$. In this case, the precision on the angle supplied by the register is better than the sexagesimal degree of an arc ($\pi/256$ rad. =42 minutes of an arc).

The register 27 has two outputs 18 and 28: when it supplies, at the output 18, an angle of value $a$ which it contains, it supplies the complementary angle ($\pi/2 - a$) at the second output 28.

The output 28 of the register 27 is connected to a second network 24, or resistance matrix II, which is identical to the network 15 and forms part of the second circuit 11. The latter comprises an amplifier 23, having the same gain $G$ as the amplifier 14, and having two inputs one of which, 22, receives the second input voltage $U_2$ while its other, subtractive input 26 receives the voltage $U'_2$ originating from a matching amplifier 25 which follows the network 24, thus forming part of a second degenerative feedback loop.

A comparator 29 receives the voltages $U'_1$ and $U'_2$ at its two inputs 30 and 31, respectively, and its output 40 controls a logical checking circuit 32 connected to an electronic clock

33. The logical checking circuit 32 controls sequentially the register 27 whose useful output is shown at 34.

If the input voltage of the network 15 is designated by $V_1$, its output being $U'_1$, and if the combination of this network with amplifier 19 has unity gain, then:

$$U'_1 = V_1 a \qquad (1)$$

Likewise:

$$V_1 = G(U_1 - U'_1) \qquad (2)$$

which merely explains the operation of the amplifier 14 of gain $G$ receiving at its input, on the one hand, the voltage $U_1$ over the line 12 and on the other hand, by way of negative feedback, the voltage $U'_1$ over the line 20.

By eliminating $V_1$ from these two relationships, the equation $$U'_1/U = Ga/(1 + Ga) \qquad (3)$$

is obtained.

In a similar manner there is:

$$\frac{U_2'}{U_2} = \frac{G\left(\frac{\pi}{2} - a\right)}{1 + G\left(\frac{\pi}{2} - a\right)} \qquad (4)$$

in the circuit 11.

The function:

$$Y_1 = Ga/1 + Ga \qquad (5)$$

will now be considered.

Figure 3:
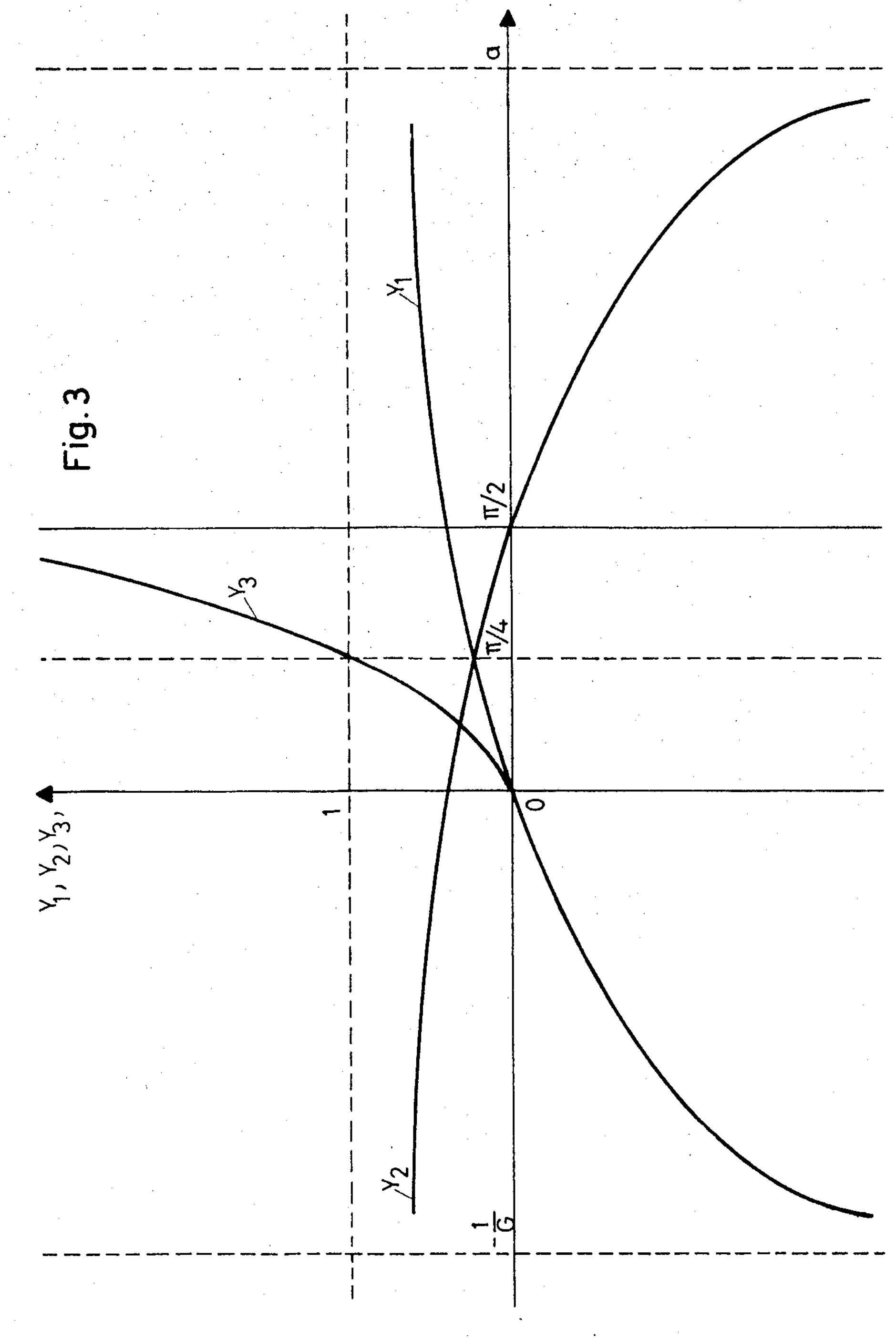
FIG. 3 is a graph.

In a system of co-ordinates $a$ and $Y_1$, as illustrated in FIG. 3 this function can be represented by an equilateral hyperbola having the asymptotes $$Y_1 = 1$$

and $$a = -1/G$$

the curve $H_1$ in FIG. 3.

The function:

$$Y_2 = \frac{G\left(\frac{\pi}{2} - a\right)}{1 + G\left(\frac{\pi}{2} - a\right)} \qquad (6)$$

will likewise be considered.

This function can be represented by another hyperbola which is symmetrical to the previous one with respect to the straight line satisfying the equation:

$$a = \pi/4$$

Dividing the two functions $Y_1$ and $Y_2$ gives:

$$Y_3 = \frac{Y_1}{Y_2} = \frac{Ga}{1 + Ga} \times \frac{1 + G\left(\frac{\pi}{2} - a\right)}{G\left(\frac{\pi}{2} - a\right)} \qquad (7)$$

The curve $Y_3$ representing this function, in the same system of co-ordinates:

passes through the origin of the co-ordinate axes (when $a = 0$, $Y_3 = 0$);

passes through the point of ordinate 1 and of abscissa $\pi/4$ (when $a = \pi/4$, $Y_3 = 1$);

has a vertical asymptote in the abscissae $\pi/2$ (when $a$ tends toward $\pi/2$, $Y_3$ tends towards infinity).

Now these three properties are likewise those of a curve representing the function tan $a$.

It is possible to plot a curve representing the function $Y_3$ for every given value of the gain $G$. It has been found that the curves representing the function $Y_3$ are very close to the curve representing tan $a$, for the positive values of $a$, *when* $G$ is selected equal or close to a certain value; in such a case we can write, with satisfactory approximation:

$$\frac{Ga}{1+Ga} \times \frac{1+G\left(\frac{\pi}{2}-a\right)}{G\left(\frac{\pi}{2}-a\right)} = \tan a \qquad (8)$$

Exact calculation, carried out on a computer, shows that with $$G=0.3534$$

the approximation to the Relationship (8) is sufficiently close to make the residual error variable as a function of $a$ along a curve which is substantially sinusoidal in appearance and whose period is $\pi/4$ while its amplitude is of the order of 2 minutes of an arc.

If the gain $G$ of the amplifiers 14 and 23 is adjusted in such a manner that its magnitude is equal or close to the value given above, it is possible to write, starting from the Relationship (8):

$$\frac{\frac{U_1'}{U_1}}{\frac{U_2'}{U_2}} = \tan a \qquad (9)$$

Therefore, if values which are respectively proportional to the cosine and the sine of an angle $a_0$ are introduced as input voltages $U_1$ and $U_2$, the operation of the register 27 introduces sequentially values of $a$ and of $\pi/2 - a$ into the networks 15 and 24, respectively. When the value $a$ at the output 18 of the register 27 is different from the value $a_0$ and consequently the value $\pi/2 - a$ at the output 28 of the register 27 is different from $\pi/2 - a_0$, then $U'_1$ and $U'_2$ are different from one another and the logical checking circuit 32 controls the register 27 sequentially to modify the value of its contents as a function of the comparison between the voltages $U'_1$ and $U'_2$ supplied to the comparator 29. Because of the distribution of the weights contained in the register 27, the values of $U'_1$ and $U'_2$ approach one another and, for a given value of the angle $a$ applied to the output 18 and of its complement $\pi/2 - a$ applied to the output 28, the values $U'_1$ and $U'_2$ are sufficiently close to one another. When equilibrium is reached, that is to say when $U'_1 = U'_2$, the Relationship (9) yields:

$$U_2/U_1 = \tan a \qquad (10)$$

and, since $U_1$ is representative of $U_0 \cos a_0$ and $U_2$ is representative of $U_0 \sin a_0$, the Relationship (10) becomes:

$$\tan a = (U_0 \sin a_0)/(U_0 \cos a_0) \qquad (11)$$

which expresses the fact that the content $a$ of the register 27 is then equal to the precise angular value $a_0$ sought with the approximation defined by the minimum value of the angular weights contained in the register 27.

This value is then delivered over the output line 34.

Figure 2:
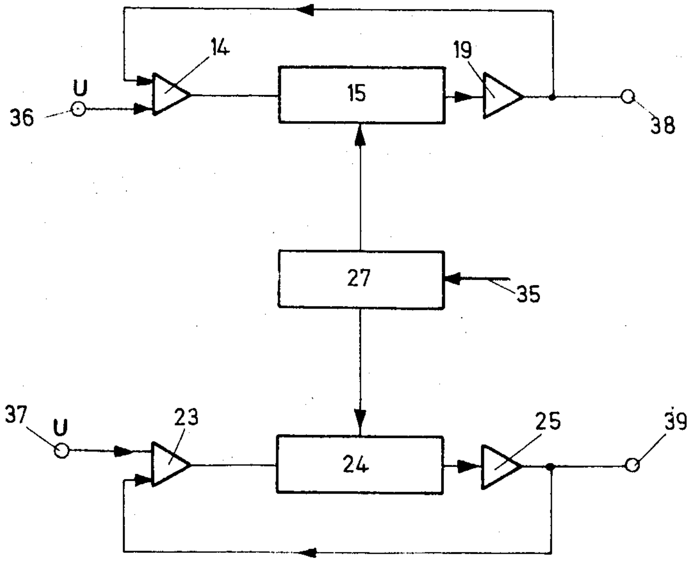
FIG. 2 is a similar diagram, but for another mode of use.

The device according to the invention can be used to supply from an angular value, which is present in digital form, analogue values whose ratio is a trigonometrical function of said angular value. For this purpose, the layout is identical with that shown in FIG. 1 but with the comparator 29 and the logical device 32 deactivated so that the operational part of the device is that shown in FIG. 2.

In this case, equal voltages $U_1 = U_2 = U$ are applied to the inputs 36 and 37. The Relationship (9) given above is then reduced to:

$$U'_1/U'_2 = \tan a \qquad (12)$$

Thus, when the gain $G$ of the amplifiers 14 and 23 has been adjusted as indicated above, the voltages taken off at the outputs 38 and 39 have magnitudes whose ratio is the tangent of the angle $a$ introduced into the register 27 over the line 35; these voltages are therefore proportional to sin $a$ and cos $a$ respectively.

In addition, the device according to the invention enables the conversion of linear data in analogue form into data in digital form or vice versa to be effected in a particularly simple manner.

For this purpose, we disconnect one of the two voltage-transformation circuits, e.g., circuit 11, leaving only the register 27, the network 15, the comparator 29 and the logical circuit 32 in operation while also cutting out the feedback loop 20. In this case, linear data introduced over the conductor 12 in analogue form are processed by the coding device to supply the corresponding digital values at its output 34.

It is therefore possible to let the device according to the invention perform functions which were previously carried out by separate devices, which is a particular advantage in data-processing installations in which the weight and overall size are important factors, as on board aircraft or missiles, for example.

We claim:

1. A device for so correlating the ratio of two analogue voltages with a digitally coded magnitude of an angle as to make said ratio equal to the tangent of said angle, comprising:
   - register means for electrically storing said digital information, said register means having first output means for delivering a first signal related to the stored information and second output means for delivering a complementary second signal;
   - first voltage-transformation means connected to receive a first input voltage $U_1$ and provided with a first degenerative loop for negatively feeding back to its own input a first output voltage $U'_1$, said first voltage-transformation means including a stage with a gain $G$ of about 0.35 and calculating means connected to said first output means for multiplying an intermediate voltage $G(U_1-U'_1)$ by the magnitude of said first signal to produce said first output voltage $U'_1$; and
   - second voltage-transformation means connected to receive a second input voltage $U_2$ and provided with a second degenerative loop for negatively feeding back to its own input a second output voltage $U'_2$, said second voltage-transformation means including a stage with the same gain $G$ and second calculating means connected to said second output means for multiplying an intermediate voltage $G(U_2-U'_2)$ by the magnitude of said second signal to produce said second output voltage $U'_2$, the ratio $U'_1/U_1 : U'_2/U_2$ being substantially equal to the tangent of said angle.

2. A device as defined in claim 1 wherein said input voltages $U_1$ and $U_2$ are identical.

3. A coder for converting a first input voltage $U_1$, proportional to the cosine of an angle to be measured, and a second input voltage $U_2$, proportional to the sine of said angle, into an electrical quantity representing said angle, comprising:
   - register means for storing said quantity, said register means having first output means for delivering a first signal related to the stored quantity and second output means for delivering a complementary second signal;
   - first voltage-transformation means connected to receive said first input voltage and provided with a first degenerative loop for negatively feeding back to its own input a first output voltage $U'_1$, said first voltage-transformation means including a stage with a gain $G$ and calculating means connected to said first output means for multiplying an intermediate voltage $(U_1-U'_1)$ by the magnitude of said first signal to produce said first output voltage $U'_1$;
   - second voltage-transformation means connected to receive said second input voltage and provided with a second degenerative loop for negatively feeding back to its own input a second output voltage $U'_2$, said second voltage-transformation means including a stage with the same gain $G$ and second calculating means connected to said second output means for multiplying an intermediate voltage $G(U_2-U'_2)$ by the magnitude of said second signal to produce said second output voltage $U'_2$; and
   - comparison means connected to receive said output voltages and to apply to said register means an error signal proportional to the difference $U'_1-U'_2$ thereof for modifying the contents of said register means in a sense tending to reduce said difference to zero.

4. A coder as defined in claim 3 wherein each of said stages is a first amplifier, the associated calculating means comprising an impedance network followed by a second amplifier.

5. A coder as defined in claim 4 wherein said register means is a binary register for storing said quantity as a combination of bits, said impedance network being a resistance matrix for converting said combination of bits into an analogue voltage proportional to the numerical value $a$ of said quantity in the case of said first calculating means and for converting the complements of said combination of bits into an analogue voltage proportional to the complementary value $\pi/2 - a$ of said quantity in the case of said second calculating means.

6. A coder as defined in claim 3 wherein said gain $G$ is about 0.35.

* * * * *